(12) United States Patent
Zheng et al.

(10) Patent No.: US 10,658,489 B2
(45) Date of Patent: May 19, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Er Hu Zheng, Shanghai (CN); Lu Jun Zou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/913,297

(22) Filed: Mar. 6, 2018

(65) Prior Publication Data

US 2018/0261610 A1 Sep. 13, 2018

(30) Foreign Application Priority Data

Mar. 7, 2017 (CN) .......................... 2017 1 0130990

(51) Int. Cl.
*H01L 29/66* (2006.01)
*H01L 21/311* (2006.01)
(Continued)

(52) U.S. Cl.
CPC .... *H01L 29/6653* (2013.01); *H01L 21/28273* (2013.01); *H01L 21/31144* (2013.01); *H01L 21/76802* (2013.01); *H01L 29/42324* (2013.01); *H01L 29/6656* (2013.01); *H01L 29/66825* (2013.01); *H01L 29/7881* (2013.01); *H01L 21/0217* (2013.01); *H01L 21/02164* (2013.01);
(Continued)

(58) Field of Classification Search
CPC ............. H01L 29/6656; H01L 29/6653; H01L 21/31144; H01L 21/31116; H01L 21/31111
See application file for complete search history.

(56) References Cited

U.S. PATENT DOCUMENTS 9,570,573 B1 * 2/2017 Fan ........................ H01L 29/45
2014/0087535 A1 * 3/2014 Roh ................. H01L 21/823412
438/285

(Continued)

*Primary Examiner* — Selim U Ahmed
*Assistant Examiner* — Evan G Clinton
(74) *Attorney, Agent, or Firm* — Anova Law Group, PLLC (57) ABSTRACT

A semiconductor device and a fabrication method are provided. The fabrication method includes providing a gate structure on a substrate and a first protective layers on the gate structure; forming an initial sidewall spacer on a sidewall of each of the gate structure and the first protective layer; forming a first sidewall spacer on a sidewall of the initial sidewall spacer, the first and initial sidewall spacers being made of different materials; forming a second sidewall spacer by removing a portion of the initial sidewall spacer, leaving a trench formed above the second sidewall spacer and between the first sidewall spacer and the first protective layer; and forming a second protective layer in the trench, the second protective layer and the first sidewall spacer being made of a same material. The second sidewall spacer has a top surface higher than or level with a top surface of the gate structure.

20 Claims, 4 Drawing Sheets

(51) Int. Cl.
    *H01L 21/768* (2006.01)
    *H01L 29/788* (2006.01)
    *H01L 21/28* (2006.01)
    *H01L 29/423* (2006.01)
    *H01L 29/06* (2006.01)
    *H01L 21/02* (2006.01)
    *H01L 29/49* (2006.01)

(52) U.S. Cl.
    CPC .... *H01L 21/31111* (2013.01); *H01L 21/31116* (2013.01); *H01L 29/0649* (2013.01); *H01L 29/4916* (2013.01)

(56) References Cited

U.S. PATENT DOCUMENTS

| | | | |
|---|---|---|---|
| 2015/0235906 A1* | 8/2015 | von Kluge | H01L 21/823857 438/591 |
| 2015/0333173 A1* | 11/2015 | Wu | H01L 29/42324 257/320 |
| 2016/0365290 A1* | 12/2016 | Cho | H01L 27/0924 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710130990.4, filed on Mar. 7, 2017, the entirety of which is incorporated herein by reference.

FIELD OF THE DISCLOSURE

The present disclosure generally relates to the field of semiconductor manufacturing technologies and, more particularly, relates to a semiconductor device and a fabrication method thereof.

BACKGROUND

A semiconductor device, such as a flash memory, may include a gate structure for controlling a channel current and a source/drain doped region on both sides of the gate structure. The source/drain doped region is used for electrically connecting the interconnect layer in post-process through conductive plugs. Before forming the conductive plug, an interlayer dielectric layer is formed covering the gate structure and the source/drain doped region, followed by forming a contact hole in the interlayer dielectric layer. The contact hole is used for accommodating the conductive plug.

As the size between adjacent gate structures decreases, the size of the contact hole between the gate structures decreases, which are then limited by lithographic limitations. As such, a self-aligned contact hole process is used to have a protective layer on both the top surface and the sidewall surface of the gate structure and an interlayer dielectric layer covering the protective layer. A patterned photoresist layer is then formed on the interlayer dielectric layer. The patterned photoresist layer has an opening, and the opening has a size along the direction perpendicular to the sidewall of the gate structure larger than a distance between the adjacent gate structures. A contact hole is further formed in the interlayer dielectric layer between the adjacent gate structures by using the protective layer as a mask.

However, the semiconductor devices formed by conventional technologies have poor electrical performance. The disclosed semiconductor device and method are directed to solve one or more problems set forth above and other problems.

BRIEF SUMMARY OF THE DISCLOSURE

The present disclosure provides a semiconductor device and the fabrication method thereof to improve the electrical performance of the formed semiconductor device.

One aspect of the present disclosure includes a method for fabricating a semiconductor device. The fabrication method includes providing a substrate; providing a gate structure on the substrate and a first protective layer on the gate structure; forming an initial sidewall spacer on a sidewall of the gate structure and a sidewall of the first protective layer; forming a first sidewall spacer on a sidewall of the initial sidewall spacer, the first sidewall spacer and the initial sidewall spacer being made of different materials; forming a second sidewall spacer by removing a portion of the initial sidewall spacer, leaving a trench formed above the second sidewall spacer and between the first sidewall spacer and the first protective layer; and forming a second protective layer in the trench, the second protective layer and the first sidewall spacer being made of the same material. The second sidewall spacer has a top surface higher than or level with the top surface of the gate structure.

Another aspect of the present disclosure includes a semiconductor device. The semiconductor device includes a substrate; a plurality of gate structures on the substrate; a first protective layer on each gate structure; a second sidewall spacer covering a sidewall of the gate structure and having a top surface higher than or level with the top surface of the gate structure; a first sidewall spacer covering a sidewall of the second sidewall spacer and having a top surface higher than a top surface of the second sidewall spacer, the first sidewall spacer and the second sidewall spacer being made of different materials; and a second protective layer located between the first sidewall spacer and the first protective layer and on the second sidewall spacer, the second protective layer and the first sidewall spacer being made of a same material.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
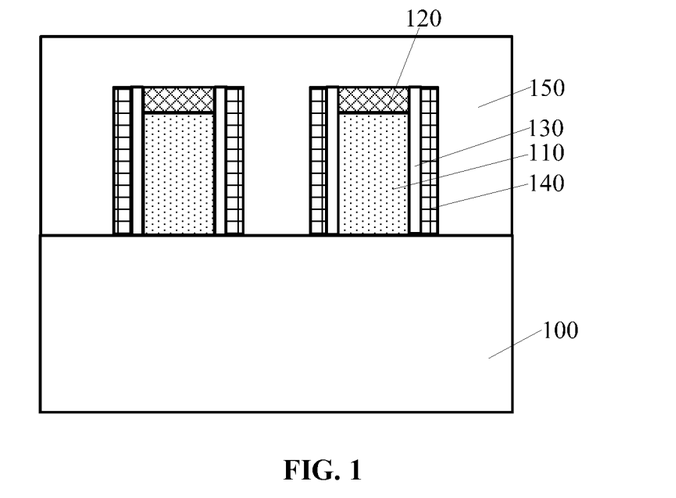
FIGS. 1 and 2 illustrate schematic structural views of a semiconductor device corresponding to certain stages of a fabrication process.
Figure 2:
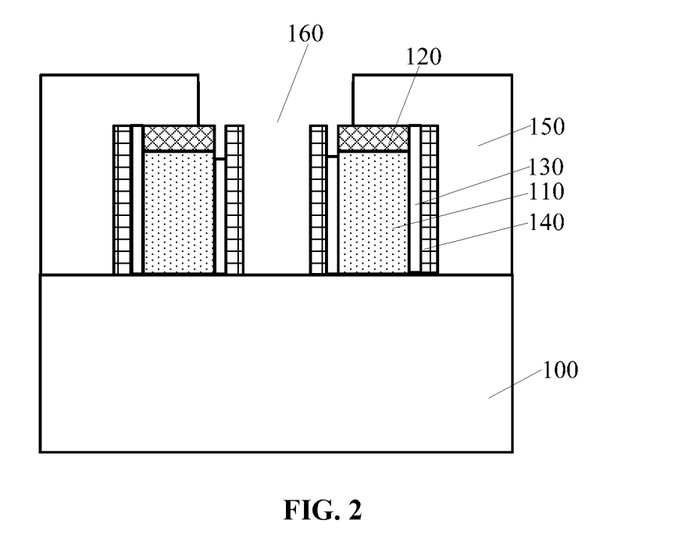

FIGS. 1 and 2 illustrate schematic structural views of a semiconductor device corresponding to certain stages of the fabrication process.

As shown in FIG. 1, a substrate 100 is provided, and the substrate 100 includes a plurality of gate structures 110 and protective layers 120 on the top surface of each gate structure 110. A first sidewall spacer 130 is formed on the sidewalls of the gate structure 110 and the sidewalls of the protective layer 120, and a second sidewall spacer 140 is formed on the sidewalls of the first sidewall spacer 130. An interlayer dielectric layer 150 is then formed on the substrate 100, and the interlayer dielectric layer 150 covers the protective layer 120, the first sidewall spacer 130, and the second sidewall spacer 140.

The first sidewall spacer 130 is made of silicon oxide, and the second sidewall spacer 140 is made of silicon nitride. Thus, the electrical isolation performance of the first sidewall spacer 130 is stronger than the electrical isolation performance of the second sidewall spacer 140.

As the operation time of the semiconductor device increases, more and more electrons fall into the second sidewall spacer 140. Since the electrical isolation performance of the first sidewall spacer 130 is stronger than the electrical isolation performance of the second sidewall spacer 140, the electrons accumulated in the second sidewall spacer 140 can be avoided going to the gate structure 110, and thus the conduction between the second sidewall spacer 140 and the gate structure 110 is avoided.

As shown in FIG. 2, a contact hole 160 is formed in the interlayer dielectric layer 150 between adjacent gate structures 110 by a self-aligned contact hole process. The contact hole 16 exposes the sidewall and top surface of the second sidewall spacer 140, the top surface of the first sidewall spacer 130, a portion of the top surface of the protective layer 120, and the substrate 100.

In one embodiment, the interlayer dielectric layer 150 is made of silicon oxide.

However, the electrical performance of the semiconductor device formed by the conventional method needs to be improved. The contact hole 160 is formed by etching the interlayer dielectric layer 150. In the process of forming the contact hole 160, it is necessary to use the first sidewall spacer 130, the second sidewall spacer 140, and the protective layer 120 as a mask. During the formation of the contact hole 160, the second sidewall spacer 140 is used as an etching stop layer to protect the sidewalls of the first sidewall spacer 130 and the gate structure 110. The first sidewall spacer 130 is exposed to the etching environment for etching interlayer dielectric layer 150. Since the interlayer dielectric layer 150 and the first sidewall spacer 130 are made of the same material, the etching selectivity ratio of the interlayer dielectric layer 150 relative to the first sidewall spacer 130 is very small during the formation of the contact hole 160, and the etching loss of the first sidewall spacer 130 is relatively severe. As a result, the upper corners of the gate structure 110 are exposed, resulting in a leakage current problem.

The present disclosure provides a method of forming a semiconductor device. The disclosed fabrication method includes: providing a substrate; providing a gate structure on the substrate and a first protective layer on the gate structure; forming an initial sidewall spacer on the sidewall of the gate structure and on the sidewall of the first protective layer; forming a first sidewall spacer on the sidewall of the first sidewall spacer, the first sidewall spacer and the initial sidewall spacer being made of different materials. After forming the first sidewall spacer, a portion of the initial sidewall spacer is removed, such that the initial sidewall spacer forms a second sidewall spacer and a trench is formed between the first sidewall spacer and the first protective layer. The second sidewall spacer is located at the bottom of the trench, and the top surface of the second sidewall spacer is higher than or level with the top surface of the gate structure. The disclosed fabrication method further includes forming a second protective layer in the trench, the second protective layer and the first sidewall spacer being made of different materials.

In the disclosed method, the first sidewall spacer and the second sidewall spacer of the sidewalls of the gate structure are used to form the sidewall spacer structure of the gate structure. The first sidewall spacer and the second sidewall spacer are made of different materials, and thus the sidewall spacer structure of the gate structure can function by combining the advantages of the material of the first sidewall spacer and the material of the second sidewall spacer. The second sidewall spacer is formed by removing a portion of the initial sidewall spacer and a trench is also formed between the first sidewall spacer and the first protective layer. The second sidewall spacer is located at the bottom of the trench, and the top surface of the second sidewall spacer is higher than or level with the top surface of the gate structure. A second protective layer is then formed in the trench. Since the second protective layer and the first sidewall spacer are made of the same material, when the first sidewall spacer has a strong protective effect on the sidewalls of the gate structure, the second protective layer also has a strong protective effect on the upper corners of the gate structure. As such, the upper corners of the gate structure cannot be easily exposed, avoiding the leakage current problem and thereby improving the performance of the semiconductor device.

Figure 8:
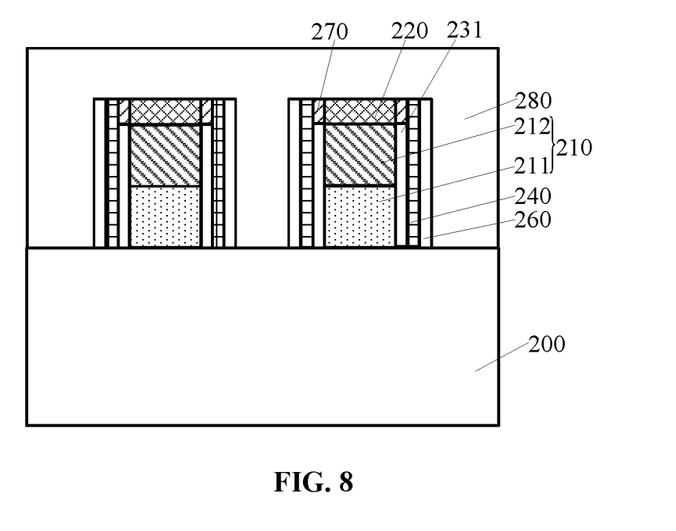
Figure 9:
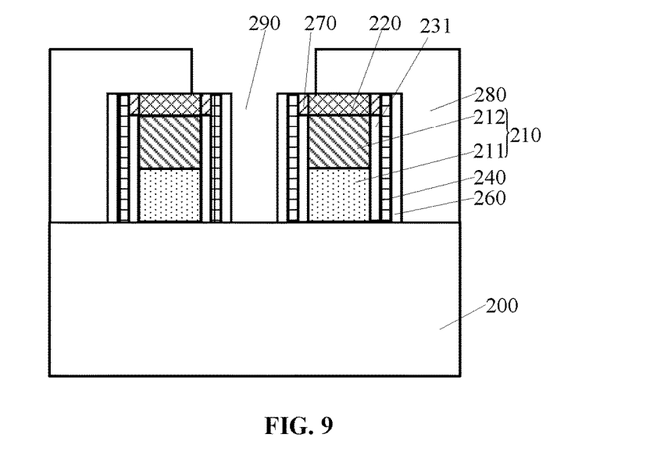
Figure 10:
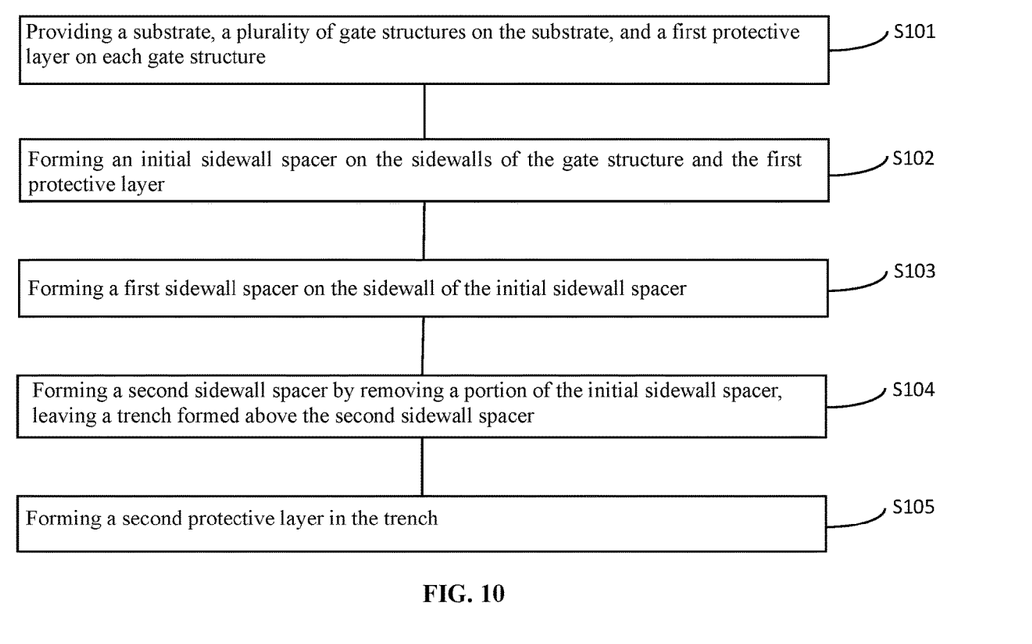
FIG. 10 illustrates an exemplary fabricating process of a semiconductor device consistent with the disclosed embodiment.

FIG. 10 illustrates an exemplary fabrication process of a semiconductor device consistent with various disclosed embodiments; and FIGS. 3-9 illustrate schematic structural views of semiconductor devices corresponding to certain stages of the exemplary fabrication process consistent with the disclosed embodiments.

As shown in FIG. 10, at the beginning of the fabrication process, a substrate is provided and a gate structure is formed on the substrate and a first protective layer is formed on the gate structure (S101).

Figure 3:
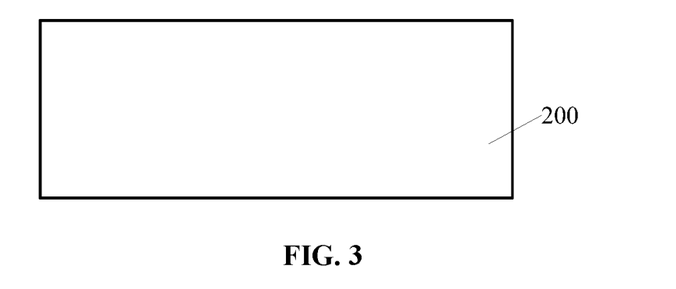
FIGS. 3-9 illustrate schematic structural views of a semiconductor device corresponding to certain stages of an exemplary fabrication process consistent with the disclosed embodiment.

As shown in FIG. 3, a substrate 200 is provided. The substrate 200 provides a processing platform for forming a semiconductor device.

The substrate 200 may be made of silicon, germanium or silicon germanium. The substrate 200 may also be made of silicon-on-insulator (SOI), germanium-on-insulator (GeOI), or silicon germanium-on-insulator (SiGeOI). In one embodiment, the substrate 200 is made of monocrystalline silicon.

Figure 4:
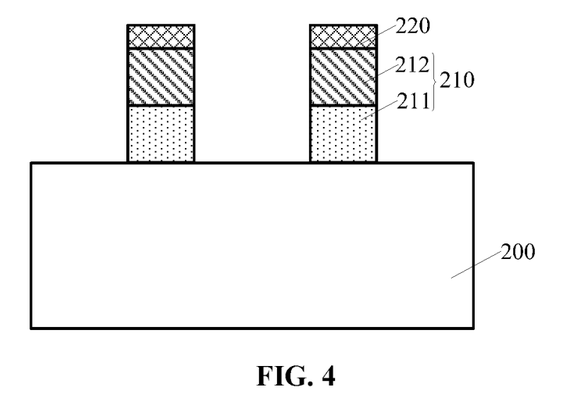

As shown in FIG. 4, a plurality of gate structures 210 are formed on the substrate 200 and a first protective layer 220 is formed on each gate structure 210.

There can be one or more gate structures 210. In one exemplary embodiment, the number of the gate structures 210 is two.

In one exemplary embodiment, the gate structure 210 includes a floating gate structure 211 and a control gate structure 212 on the floating gate structure 211. Correspondingly, the semiconductor device is a memory.

The floating gate structure 211 includes a floating gate dielectric layer (not illustrated) on the substrate 200 and a floating gate electrode layer (not illustrated) on the floating gate dielectric layer.

The floating gate dielectric layer is made of silicon oxide or a high-K (K>3.9) dielectric material. The floating gate electrode layer is made of polysilicon.

The control gate structure 212 includes a control gate dielectric layer (not illustrated) on the floating gate structure 211 and a control gate electrode layer (not illustrated) on the control gate dielectric layer.

The control gate dielectric layer is a single layer structure or a laminated structure. If the control gate dielectric layer is a monolayer structure, the control gate dielectric layer is made of silicon oxide; if the control gate dielectric layer is a laminated structure, the control gate dielectric layer includes a first control gate dielectric layer, a second control gate dielectric layer on the first control gate dielectric layer, and a third control gate dielectric layer on the second control gate dielectric layer. The first control gate dielectric layer and the third control gate dielectric layer are made of silicon oxide, and the second control gate dielectric layer is made of silicon nitride.

In one embodiment, the control gate electrode layer is made of polysilicon.

In one embodiment, an isolation layer (not illustrated) is formed, and the isolation layer is formed during the formation of the gate structure 210.

For example, an initial floating gate structure film (not illustrated) is formed on the substrate 200 and a mask material layer (not illustrated) is formed on the initial floating gate structure film. The mask material layer, the initial floating gate structure film, and a portion of the substrate 200 are patterned to form a floating gate structure film on the substrate 200 and a mask layer on the floating gate structure film. A trench is simultaneously formed, and the trench is located between adjacent floating gate structure films, between adjacent mask layers and in the substrate 200. An isolation layer is then formed in the trench. After forming the isolation layer, the mask layer is removed. After removing the mask layer, a control gate structure film (not illustrated) is formed on the substrate 200, the floating gate structure film, and the isolation layer. A patterned first protective layer 220 is formed on the control gate structure film, and the extending direction of the first protective layer 220 is perpendicular to the extending direction of the floating gate structure film. The control gate structure film and the floating gate structure film are etched by using the first protective layer 220 as a mask, such that the floating gate structure film forms a floating gate structure 211 and the control gate structure film forms the control gate structure 212. The floating gate structure 2 and the control gate structure 212 constitute the gate structure 210.

In one embodiment, the isolation layer is made of silicon oxide.

The top surface of the isolation layer is higher than the top surface of the floating gate structure film; or, the top surface of the isolation layer is higher than the top surface of the substrate 200 and lower than the top surface of the floating gate structure film; or the top surface of the isolation layer is level with the top surface of the floating gate structure film. In one exemplary embodiment, the top surface of the isolation layer is higher than the top surface of the floating gate structure film.

The control gate structure 212 crosses over the isolation layer between the floating gate structures 211.

In other embodiments, the gate structure may also include a gate dielectric layer and a gate electrode layer on the gate dielectric layer. Correspondingly, the semiconductor device is a MOS transistor.

In one embodiment, the subsequently formed contact hole exposes a portion of the top surface of the first protective layer 220, and the first protective layer 220 and the subsequent third sidewall spacer are made of the same material. In one embodiment, the first protective layer 220 is made of silicon nitride.

In other embodiments, the subsequently formed contact hole does not expose the first protective layer 220, and the first protective layer 220 is made of silicon dioxide or silicon nitride.

Returning to FIG. 10, after providing a substrate, the fabrication method further includes forming an initial sidewall spacer (S102).

Figure 5:
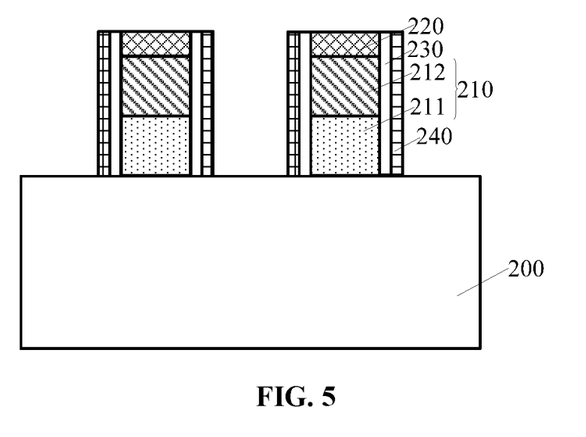

As shown in FIG. 5, an initial sidewall spacer 230 is formed on the sidewall of the gate structure 210 and on the sidewall of the first protective layer 220.

The electrical isolation performance of the material of the initial sidewall 230 is stronger than the electrical isolation performances of the material of the first sidewall and the material of the third sidewall formed separately.

The initial sidewall spacer 230 is made of $SiO_2$ or SiOC. In one embodiment, the initial sidewall spacer 230 is made of $SiO_2$.

The initial sidewall spacer 230 is used to subsequently form the second sidewall spacer. The method of forming the initial sidewall spacer 230 includes forming an initial sidewall material layer on the sidewalls of the gate structure 210, on the sidewall and top surfaces of the first protective layer 220, and on the substrate 200; etching back the initial sidewall material layer until the top surface of the first protective layer 220 and the surface of the substrate 200 are exposed; and forming the initial sidewall spacer 230.

In one embodiment, the process of forming the initial sidewall material layer is a deposition process, such as a plasma chemical vapor deposition process or an atomic layer deposition process. In another embodiment, the process of forming the initial sidewall material layer is an oxidation process.

The process of etching back the initial sidewall material layer includes, for example, an anisotropic dry etching process.

Returning to FIG. 10, after forming an initial sidewall spacer, the fabrication method further includes forming a first sidewall spacer (S103).

As shown in FIG. 5, a first sidewall spacer 240 is formed on the sidewall of the initial sidewall spacer 230. The first sidewall spacer 240 and the initial sidewall spacer 230 are made of different materials.

The first sidewall spacer 240 is used to protect the sidewalls of the initial sidewall spacer 230 covering the sidewalls of the gate structure 210, avoiding the etching damage to the sidewall of the initial sidewall spacer 230 covering the sidewalls of the gate structure 210 when subsequently removing a portion of the sidewall spacer 230.

For example, the first sidewall spacer 240 is made of SiN, SiBCN, or AlN. In one embodiment, the first sidewall spacer 240 is made of SiN.

The method of forming the first sidewall spacer 240 includes forming a first sidewall material layer on the sidewall and the top surface of the initial sidewall spacer 230, on the top surface of the first protective layer 220, and on the surface of the substrate 200; etching back the first sidewall material layer until the top surfaces of the first protective layer 220 and the initial sidewall spacer 230 and the surface of the substrate 200 are exposed, forming the first sidewall spacer 240.

The process of forming the first sidewall material layer is a deposition process, such as a plasma chemical vapor deposition process or an atomic layer deposition process. The process of forming the first sidewall material layer may also be a furnace tube process.

The process of etching back the first sidewall material layer includes, for example, an anisotropic dry etching process.

In one embodiment, the thickness of the first sidewall spacer 240 is in a range of 1 nm to 20 nm. If the thickness of the first sidewall spacer 240 is too small, the damage to the top region of the first sidewall spacer 240 will be relatively severe when subsequently etching to remove a portion of the initial sidewall spacer 230. Correspondingly, the depth of the subsequently formed trench at the side of the first sidewall spacer 240 will be very different from the depth at the side of the gate structure 210, resulting in different heights of the subsequently formed second protective layer at the side of the first sidewall spacer 240 and at the side of the gate structure 210. The height of the second protective layer is the size in the direction perpendicular to the top surface of the gate structure 210. If the thickness of the first sidewall spacer 240 is too large, when the total thickness of the initial sidewall spacer 230, the first sidewall spacer 240 and the subsequently formed third sidewall spacer remains constant, the space for the subsequently formed third sidewall spacer will be too small. In addition, a too thick first sidewall spacer 240 causes processing waste.

The thickness of the first sidewall spacer 240 is the size along the direction parallel to the direction in which the gate structures 210 are aligned.

Returning to FIG. 10, after forming the first sidewall spacer, the fabrication method further includes forming a second sidewall spacer by removing a portion of the initial sidewall spacer, leaving a trench between the first sidewall spacer and the first protective layer (S104).

Figure 6:
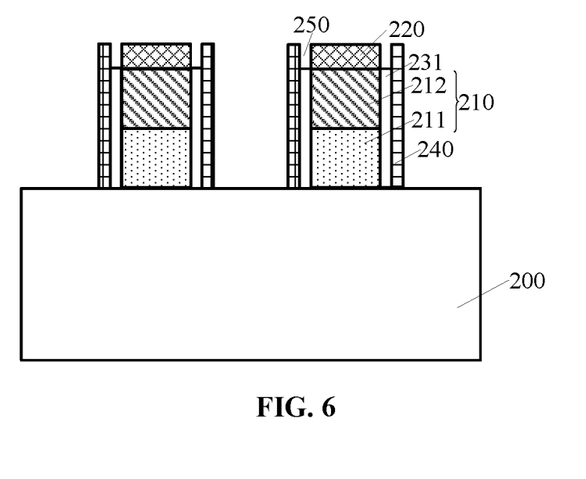

As shown in FIG. 6, after forming the first sidewall spacer 240, a portion of the initial sidewall spacer 230 is removed, such that the initial sidewall spacer 230 forms the second sidewall spacer 231 and a trench 250 is formed between the first sidewall spacer 240 and the first protective layer 220. The second sidewall spacer 231 is under the bottom of the trench 250, and the top surface of the second sidewall spacer 231 is higher than or level with the top surface of the gate structure 210.

The role of the second sidewall spacer 231 is as follows: as the operation time of the semiconductor device increases, more and more electrons fall into the first sidewall spacer 240 and the subsequently formed third sidewall spacer. Since the electrical isolation performance of the second sidewall spacer 231 is stronger than the electrical isolation performance of the first sidewall spacer 240 and the subsequently formed third sidewall spacer, the accumulated electrons at the first sidewall spacer 240 and the third sidewall spacer can be avoided from reaching the gate structure 210 and the conduction between the first sidewall spacer 240, the third sidewall spacer, and the gate structure 210 is avoided.

In one embodiment, the thickness of the second sidewall spacer 231 is in a range of 1 nm to 10 nm. If the thickness of the second sidewall spacer 231 is too large, in the case that the total thickness of the first sidewall spacer 240, the second sidewall spacer 231, and the subsequently formed third sidewall spacer remains constant, the space for forming the second sidewall spacer 231 and the third sidewall spacer will be too small. Further, a too thick second sidewall spacer 231 can cause processing waste. If the thickness of the second sidewall spacer 231 is too small, the ability of the second sidewall spacer 231 to isolate the subsequently formed first sidewall spacer and the gate structure 210 and to isolate the subsequently formed third sidewall spacer and the gate structures 210 is limited.

In one embodiment, the top surface of the second sidewall surface 231 is higher than the top surface of the gate structure 210. The advantage is that the upper corners of the gate structure 210 are prevented from being exposed.

A wet cleaning process is performed prior to the subsequent formation of the second protective layer. For example, when subsequently forming the sidewall protective material layer using a furnace tube process, it is necessary to use a wet cleaning process to clean the sidewalls of the trench 250 and the sidewalls of the first sidewall spacer 240 to enhance the adhesion of the sidewall protection material layer on the sidewalls of the trench 250 and the first sidewall spacer 240.

Because the top surface of the second sidewall spacer 231 is higher than the top surface of the gate structure 210, the second sidewall spacer 231 and the first protective layer 220 are capable of wrapping the gate structure 210. Thus, the etching solution for the wet etching process can be prevented from contacting with the upper corners of the gate structure 210 during the wet etching process, avoiding the etching damage to the upper corners of the gate structure 210.

In one embodiment, the process of removing a portion of the initial sidewall spacer 230 is a wet etching process. The processing parameters are as follows: the etching solution being a hydrofluoric acid solution, the mass fraction of the hydrofluoric acid being in a range of 0.001% to 2%, and the etching temperature being 10° C. to 50° C.

If the mass percentage concentration of the hydrofluoric acid is too large or the etching temperature is too high, the etching rate of the wet etching process will increase and it is difficult to control the progress of the wet etching process. If the mass percentage concentration of the hydrofluoric acid is too small or the etching temperature is too low, the etching rate of the wet etching process will decrease, resulting in low efficiency of the wet etching process.

In another embodiment, the process of removing a portion of the initial sidewall spacer 230 is a dry etching process. The dry etching process includes an etching gas of $NF_3$ and $NH_3$, a total flow rate of the etching gas being in a range of 50 sccm to 600 sccm, a power of the source radio frequency (RF) in a range of 10 watts~500 watts, and a chamber pressure in a range of 3 mtorr~200 mtorr.

During the dry etching process, by-products may be produced.

The causes of choosing the aforementioned parameters for the dry etching process include: on the one hand, a part of the by-products adheres to the sidewall and top surface of the first sidewall spacer 240, thereby protecting the first sidewall spacer 240; on the other hand, the accumulated by-products should not be too much to reduce the etching rate of the dry etching process.

Returning to FIG. 10, the fabrication method further includes forming a second protective layer (S105).

Figure 7:
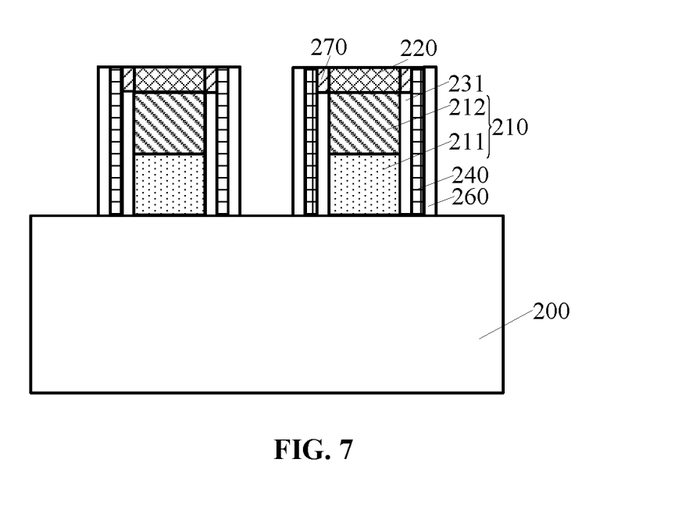

As shown in FIG. 7, a second protective layer 270 is formed in the trench 250 (see FIG. 6). The second protective layer 270 and the first sidewall spacer 240 are made of the same material.

The disclosed embodiment further includes forming a third sidewall spacer 260 on the sidewall of the first sidewall spacer 240. The third sidewall spacer 260 and the first sidewall spacer 240 are made of the same material. A second protective layer 270 is formed simultaneously when forming the third sidewall spacer 260.

The second protective layer 270 may be made of SiN, SiBCN or AlN. In one exemplary embodiment, the second protective layer 270 is made of SiN.

The third sidewall spacer 260 may be made of SiN, SiBCN, or AlN. In one exemplary embodiment, the third sidewall spacer 260 is made of SiN.

The first sidewall spacer 240, the second sidewall spacer 231, and the third sidewall spacer 260 of the sidewall of the gate structure 210 are used to form the sidewall structure of the gate structure 210. The first sidewall spacer 240 and the third sidewall spacer 260 are made of the same material. Also, the material of the second sidewall spacer 231 is different from the material of the first sidewall spacer 240 and different from the material of the third sidewall spacer 260, respectively. Therefore, the sidewall structure of the gate structure 210 can function by combining the advantages of the materials of the second sidewall spacer 231, the first sidewall spacer 240, and the third sidewall spacer 260.

Since the second protective layer 270, the first sidewall spacer 240, and the third sidewall spacer 260 are made of the same material, when the protective effect of the material of the first sidewall spacer 240 and the third sidewall spacer 260 to the sidewall of the gate structure 210 is relatively strong, the second protective layer 270 also has a strong ability to protect the upper corners of the gate structure 210. Thus, the upper corners of the gate structure 210 are not exposed, avoiding the leakage current problem and improving the performance of the semiconductor device. In one embodiment, the selection of the material for the first sidewall spacer 240, the second sidewall spacer 231, and the third sidewall spacer 260 should satisfy the following criterion: during the subsequent formation of the contact hole, the etching selectivity ratio of the subsequently formed interlayer dielectric layer relative to the third sidewall spacer 260 and the etching selectivity ratio of the interlayer dielectric layer relative to the first sidewall spacer 240 are the first ratio; during the formation of the contact hole, the etching selectivity ratio of the subsequently formed interlayer dielectric layer relative to the second sidewall spacer 231 is the second ratio; the second ratio is less than the first ratio; and the electrical isolation performance of the second sidewall spacer 231 is stronger than the electrical isolation performances of the first sidewall spacer 240 and the third sidewall spacer 260, respectively.

The method of forming the third sidewall spacer 260 and the second protective layer 270 includes, forming a sidewall protective material layer (not illustrated) on the substrate 200, the top and sidewall surfaces of the first sidewall spacer 240, the top surface of the first protective layer 220, and in the trench 250; re-etching the sidewall protective material layer to form the third sidewall spacer 260 and the second protective layer 270.

The process of forming the sidewall protective material layer is a deposition process, such as a plasma chemical vapor deposition process or an atomic layer deposition process. The process of forming the sidewall protective material layer may also be a furnace tube process.

The process of etching the sidewall protective material layer includes, for example, an anisotropic dry etching process.

In one embodiment, the role of the third sidewall spacer 260 and the first sidewall spacer 240 includes, when subsequently forming the contact hole, the third sidewall spacer 260 and the first sidewall spacer 240 are used as an etching stop layer to protect the sidewalls of the second sidewall spacer 231 and the gate structure 210.

In one embodiment, the thickness of the third sidewall spacer 260 is in a range of 1 nm to 20 nm.

The thickness of the second sidewall spacer 231 is in a range of 1 nm to 10 nm, the thickness of the first sidewall spacer 240 is in a range of 1 nm to 20 nm, and the thickness of the third sidewall spacer 260 is in a range of 1 nm to 20 nm. The overall thickness of the sidewall spacer 240, the second sidewall spacer 231, and the third sidewall spacer 260 should satisfy the following criterion: on one hand, the size of the subsequently formed contact hole in the aligned direction of the gate structure 210 should not be too small and the ratio between the depth and width of the contact hole should not be too large, reducing the difficulty of subsequently forming the contact hole; on the other hand, the electrical isolation role of the first sidewall spacer 240, the second sidewall spacer 231, and the third sidewall spacer 260 on the gate structure 210 should not be too small, reducing the probability of leakage in the gate structure 210.

As shown in FIG. 8, an interlayer dielectric layer 280 is formed, and the interlayer dielectric layer 280 covers the third sidewall spacer 260, the first sidewall spacer 240, the second protective layer 270, the first protective layer 220, and the substrate 200.

The etching selectivity ratio of the interlayer dielectric layer 280 with respect to the second sidewall spacer 231 is relatively small during the subsequent formation of the contact hole. In one embodiment, the interlayer dielectric layer 280 and the second sidewall spacer 231 are made of the same material.

In one embodiment, the interlayer dielectric layer 280 is made of silicon oxide.

The process of forming the interlayer dielectric layer 280 may be a deposition process, such as a fluid chemical vapor deposition process, a plasma chemical vapor deposition process, a low pressure chemical vapor deposition process, or a subatmospheric chemical vapor deposition process.

As shown in FIG. 9, a patterned mask layer (not illustrated) is formed on the interlayer dielectric layer 280, and the patterned mask layer has an opening. The opening is located on the interlayer dielectric layer 280 between adjacent gate structures 210, and the opening is larger in size in the aligned direction of the gate structures 210 than the distance between the adjacent gate structures 210. The interlayer dielectric layer 280 is etched by using the patterned mask layer as a mask, forming a contact hole 290 in the interlayer dielectric layer 280 between adjacent gate structures 210. The contact hole exposes the sidewall surface and the top surface of the third sidewall spacer 260, the top surface of the first sidewall spacer 240, the top surface of the second protective layer 270, and the substrate 200. After forming the contact hole 290, the patterned mask layer is removed.

The patterned mask layer is used to determine the position of the contact hole 290. The patterned mask layer is made of a photoresist, for example.

As the feature size of the semiconductor device is continuously reduced, the distance between the adjacent gate structures 210 is decreasing and the size of the contact hole 290 in the aligned direction of the gate structures 210 is continuously reduced. Since the size of the opening in the aligned direction of the gate structures 210 is greater than the distance between the adjacent gate structures 210, the opening is prevented from being limited by the lithographic limits, making the opening in the patterned mask layer easy to form.

In one embodiment, the contact hole 290 also exposes a portion of the top surface of the first protective layer 220. Accordingly, the first protective layer 220 and the third sidewall spacer 260 are made of the same material. In this case, the first protective layer 220 is capable of protecting the top surface of the gate structure 210 during the formation of the contact hole 290.

In other embodiments, the contact hole 290 does not expose the first protective layer 220. The first protective layer 220 and the third sidewall space 260 may be made of the same or different materials. Correspondingly, the first protective layer 220 is made of silicon dioxide or silicon nitride.

During the formation of the contact hole 290, the etching selectivity ratio of the interlayer dielectric layer 280 relative to the third sidewall spacer 260 and the etching selectivity ratio of the interlayer dielectric layer 280 relative to the first sidewall spacer 240 is the first ratio. During the formation of the contact hole 290, the etching selectivity ratio of the interlayer dielectric layer 280 relative to the second sidewall spacer 231 is the second ratio. The second ratio is less than the first ratio, such that the first sidewall spacer 240 and the third sidewall spacer 260 have a relatively strong protective effect on the second sidewall spacer 231 and the gate structure 210.

The third sidewall spacer 260, the first sidewall spacer 240, and the second protective layer 270 are used as a mask during the formation of the contact hole 290. Since the second protective layer 270 and the first sidewall spacer 240 and the third sidewall spacer 260 are made of the same material, during the formation of the contact hole 290, when the third sidewall spacer 260 and the first sidewall spacer 240 have a relatively strong protective effect on the sidewall of the gate structure 210, the second protective layer 270 also has a strong protective effect on the upper corners of the gate structure 210. Thus, the upper corners of the gate structure 210 cannot be easily exposed during the formation of the contact hole 290, avoiding the leakage current problem.

Accordingly, the present disclosure also provides a semiconductor device.

As shown in FIG. 9, the semiconductor device includes: a substrate 200; a gate structure 210 on the substrate 200; a first protective layer 220 on the top surface of the gate structure 210; a second sidewall spacer 231 covering the sidewalls of the gate structure 210. The top surface of the second sidewall spacer 231 is higher than or level with the top surface of the gate structure 210 and the top surface of the second sidewall spacer 231 is lower than the top surface of the first protective layer 220. The semiconductor device further includes a first sidewall spacer 240 covering the sidewall of the second sidewall spacer 231. The top surface of the first sidewall spacer 240 is higher than the top surface of the second sidewall spacer 231. The first sidewall spacer 240 and the second sidewall spacer 231 are made of different materials. The semiconductor device further includes a second protective layer 270 locating between the first sidewall spacer 240 and the first protective layer 220 and on the second sidewall spacer 231. The second protective layer 270 and the first sidewall spacer 240 are made of the same material.

The substrate 200 is made of the material as above and will not be repeated herein in detail. The number of the gate structures 210 may be one or more.

The electrical isolation performance of the second sidewall spacer 231 is stronger than the electrical isolation performances of the first sidewall spacer 240 and the third sidewall spacer 260, respectively.

The second sidewall spacer 240 may be made of $SiO_2$ or SiOC. The first sidewall spacer 240 and the third sidewall spacer 260 may be made of SiN, SiBCN or AlN.

In various embodiments, the thickness of the second sidewall spacer 231 is in a range of 1 nm to 10 nm; the thickness of the first sidewall spacer 240 is in a range of 1 nm to 20 nm; and the thickness of the third sidewall spacer 260 is in a range of 1 nm to 20 nm.

The semiconductor device also includes a third sidewall spacer 260 that covers the sidewall of the first sidewall spacer 240. The third sidewall spacer and the first sidewall spacer 240 are made of the same material.

The semiconductor device also includes an interlayer dielectric layer 280, and the interlayer dielectric layer 280 covers the third sidewall spacer 260, the first sidewall spacer 240, the second protective layer 270, the first protective layer 220, and the substrate 200; a contact hole 290 extending through the interlayer dielectric layer 280. The contact hole 290 is located between adjacent gate structures 210 and the contact hole 290 exposes the sidewall surface and the top surface of the third sidewall spacer 260, the top surface of the first sidewall spacer 240, the top surface of the second protective layer 270, and the substrate 200.

The contact hole 290 also exposes a portion of the top surface of the first protective layer 220. The first protective layer 220 and the third sidewall spacer 260 are made of the same material.

The interlayer dielectric layer 280 and the second sidewall spacer 231 are made of the same material.

Compared with conventional technologies, the fabrication method in the present disclosure has the following advantages.

As disclosed, the first sidewall spacer and the second sidewall spacer of the sidewalls of the gate structure are used for constituting the sidewall spacer structures of the gate structure. The first sidewall spacer and the second sidewall spacer are made of different materials, such that the sidewall spacer structure of the gate structure can function by combining the advantages of the material of the first sidewall spacer and the material of the second sidewall spacer. A portion of the initial sidewall spacer is removed to form a second sidewall spacer. A trench is also formed between the first sidewall spacer and the first protective layer. The second sidewall spacer is located under the bottom of the trench, and the top surface of the second sidewall spacer is higher than or level with the top surface of the gate structure. Then a second protective layer is formed in the trench. Since the second protective layer and the first sidewall spacer are made of the same material, when the material of the first sidewall spacer has a strong protective effect on the sidewalls of the gate structure, the second protective layer also has a strong protective effect on the upper corners of the gate structure. As such, the upper corners of the gate structure cannot be easily exposed, avoiding the leakage current problem and improving the performance of the semiconductor device.

In the semiconductor device provided by the present disclosure, the first sidewall spacer and the second sidewall spacer of the sidewalls of the gate structure are used for constituting the sidewall spacer structures of the gate structure. Since the first sidewall spacer and the second sidewall spacer are made of different materials, the sidewall spacer structures of the gate structure can function by combining the advantages of the material of the first sidewall spacer and the material of the second sidewall spacer. Because the second protective layer and the first sidewall spacer are made of the same material, when the material of the first sidewall spacer has a strong protective effect on the sidewalls of the gate structure, the second protective layer also has a strong protective effect on the upper corners of the gate structure. As such, the upper corners of the gate structure cannot be easily exposed, avoiding the leakage current problem and improving the performance of the semiconductor device.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor device, comprising:
   providing a substrate;
   providing a gate structure on the substrate and a first protective layer on the gate structure;
   forming an initial sidewall spacer on a sidewall of the gate structure and a sidewall of the first protective layer;
   forming a first sidewall spacer on a sidewall of the initial sidewall spacer, the first sidewall spacer and the initial sidewall spacer being made of different materials;
   forming a second sidewall spacer by removing a portion of the initial sidewall spacer, leaving a trench formed above the second sidewall spacer and between the first sidewall spacer and the first protective layer, wherein the second sidewall spacer has a top surface level with a top surface of the gate structure; and
   forming a second protective layer in the trench, the second protective layer and the first sidewall spacer being made of a same material, wherein the same material has a lower etching selectivity and a weaker isolation performance than a material of the second sidewall spacer, and the second protective layer has a top surface level with a top surface of the first protective layer and a bottom surface level with the top surface of the gate structure.

2. The method according to claim 1, further comprising:
   forming a third sidewall spacer on a sidewall of the first sidewall spacer, the third sidewall spacer and the first sidewall spacer being made of the same material; and
   forming the second protective layer while forming the third sidewall spacer, wherein the first protective layer, the second protective layer, the first sidewall spacer, and the third sidewall spacer have top surfaces coplanar with each other.

3. The method according to claim 2, wherein the third sidewall spacer and the second protective layer are formed by:
   forming a sidewall protective material layer on the substrate, on top and sidewall surfaces of the first sidewall spacer, on the first protective layer, and in the trench; and
   etching back the sidewall protective material layer to form the third sidewall spacer and the second protective layer.

4. The method according to claim 2, further comprising:
   providing a plurality of gate structures on the substrate, wherein the method further includes:
   forming an interlayer dielectric layer covering the third sidewall spacer, the first sidewall spacer, the second protective layer, the first protective layer, and the substrate;
   forming a patterned mask layer on the interlayer dielectric layer; and
   using the patterned mask layer as a mask to etch the interlayer dielectric layer to form a contact hole in the interlayer dielectric layer between adjacent gate structures, the contact hole exposing top and sidewall surfaces of the third sidewall spacer, the top surface of the first sidewall spacer, a top surface of the second protective layer, and the substrate.

5. The method according to claim 4, wherein:
   the contact hole further exposes a portion of the top surface of the first protective layer.

6. The method according to claim 5, wherein:
   the first protective layer and the third sidewall spacer are made of a same material.

7. The method according to claim 4, wherein:
   the interlayer dielectric layer and the second sidewall spacer are made of a same material.

8. The method according to claim 4, wherein:
   when forming the contact hole, an etching selectivity ratio of the interlayer dielectric layer relative to the third sidewall spacer or an etching selectivity ratio of the interlayer dielectric layer relative to the first sidewall spacer is a first ratio;
   when forming the contact hole, an etching selectivity ratio of the interlayer dielectric layer relative to the second sidewall spacer is a second ratio;
   the second ration is less than the first ratio; and
   the second sidewall spacer is made of a material having an electrical isolation performance stronger than the first sidewall spacer and the third sidewall spacer.

9. The method according to claim 8, wherein:
   the second sidewall spacer is made of $SiO_2$ or SiOC; and
   the first sidewall spacer and the third sidewall spacer are made of SiN, SiBCN or AlN.

10. The method according to claim 1, wherein:
    a thickness of the first sidewall spacer is in a range of about 1 nm to about 20 nm; and
    a thickness of the second sidewall spacer is in a range of about 1 nm to about 10 nm.

11. The method according to claim 1, wherein:
    removing the portion of the initial sidewall spacer includes a wet etching process using an etching solution including a hydrofluoric acid solution, wherein:
    a mass percentage concentration of the hydrofluoric acid is about 0.001% to about 2%, and an etching temperature is in the range of about 10° C. to about 50° C.

12. The method according to claim 1, wherein:
    removing the portion of the initial sidewall spacer includes a dry etching process, including:
    an etching gas including $NF_3$ and $NH_3$, a total flow of the etching gas being in a range of about 50 sccm about 600 sccm,
    a source RF power in the range of about 10 W~about 500 W, and
    a chamber pressure in the range of about 3 mtorr~about 200 mtorr.

13. A semiconductor device, comprising:
    a substrate;
    a plurality of gate structures on the substrate;
    a first protective layer on each gate structure;
    a second sidewall spacer covering a sidewall of the each gate structure and having a top surface higher than or level with a top surface of the each gate structure;
    a first sidewall spacer on a sidewall of the second sidewall spacer and having a top surface higher than the second sidewall spacer, the first sidewall spacer and the second sidewall spacer being made of different materials; and
    a second protective layer located between the first sidewall spacer and the first protective layer and on the second sidewall spacer, the second protective layer and the first sidewall being made of a same material, wherein the same material has a lower etching selectivity and a weaker isolation performance than a material of the second sidewall spacer, and the second protective layer has a top surface level with a top surface of the first protective layer and a bottom surface level with the top surface of the gate structure.

14. The semiconductor device according to claim 13, further comprising:
a third sidewall spacer covering a sidewall of the first sidewall spacer, the third sidewall spacer and the first sidewall spacer being made of a same material.

15. The semiconductor device according to claim 14, wherein:
the semiconductor device further includes an interlayer dielectric layer covering the third sidewall spacer, the first sidewall spacer, the second protective layer, the first protective layer and the substrate; and
a contact hole extends through the interlayer dielectric layer and is located between adjacent gate structures, the contact hole exposing top and sidewall surfaces of the third sidewall spacer, the top surface of the first sidewall spacer, a top surface of the second protective layer, and the substrate.

16. The semiconductor device according to claim 15, wherein:
the contact hole further exposes a portion of the top surface of the first protective layer; and
the first protective layer and the third sidewall spacer are made of a same material.

17. The semiconductor device according to claim 15, wherein:
the interlayer dielectric layer and the second sidewall spacer are made of a same material.

18. The semiconductor device according to claim 13, wherein:
the second sidewall spacer is made of a material having an electrical isolation performance stronger than the first sidewall spacer and the third sidewall spacer, respectively.

19. The semiconductor device according to claim 18, wherein:
the second sidewall spacer is made of $SiO_2$ or SiOC; and
the first sidewall spacer and the third sidewall spacer are made of SiN, SiBCN, or AlN.

20. The semiconductor device according to claim 13, wherein:
the each gate structure includes a floating gate structure and a control gate structure on the floating gate structure.

* * * * *